United States Patent [19]

Sakata

[11] Patent Number: 4,626,797
[45] Date of Patent: Dec. 2, 1986

[54] PHASE LOCKED LOOP PROVIDING THREE-LEVEL CONTROL SIGNAL TO VCO

[75] Inventor: Tsuguhide Sakata, Tokyo, Japan

[73] Assignee: Canon Kabushiki Kaisha, Tokyo, Japan

[21] Appl. No.: 659,717

[22] Filed: Oct. 11, 1984

[30] Foreign Application Priority Data

Oct. 14, 1983 [JP] Japan .................. 58-193136
Oct. 14, 1983 [JP] Japan .................. 58-193137

[51] Int. Cl.$^4$ .............................................. H03L 7/08
[52] U.S. Cl. ...................... 331/1 A; 331/8; 331/14; 331/27; 331/17
[58] Field of Search .............. 331/1 A, 8, 14, 25, 331/27, 16, 17

[56] References Cited

U.S. PATENT DOCUMENTS

| | | | |
|---|---|---|---|
| 3,899,746 | 8/1975 | Gammel | 331/14 X |
| 4,123,726 | 10/1978 | Schucht | 331/14 |
| 4,330,759 | 5/1982 | Anderson | 331/25 X |
| 4,513,255 | 4/1985 | Terbrack | 331/27 X |
| 4,520,319 | 5/1985 | Baker | 331/25 X |

Primary Examiner—Siegfried H. Grimm
Attorney, Agent, or Firm—Toren, McGeady, Stanger, Goldberg & Kiel

[57] ABSTRACT

In the disclosed phase-locked loop circuit, a phase detecting circuit produces a control signal for controlling the frequency of an oscillator according to the phase difference between the output of the oscillator and an input signal. The control signal controls the oscillator only during a specific period of time in which there is a phase difference. This eliminates the need for a low pass loop filter and results in a quick response, stable phase-locked loop circuit.

17 Claims, 22 Drawing Figures

PHASE LOCKED LOOP PROVIDING THREE-LEVEL CONTROL SIGNAL TO VCO

BACKGROUND OF THE INVENTION

1. Field of the Invention

This invention relates to improvements in a phase-locked loop circuit (hereinafter referred to as a PLL circuit) for obtaining output oscillations in phase with an incoming signal.

2. Description of the Prior Art

Analog and digital PLL circuits are often used in various types of apparatus. However, these conventional PLL circuits have not been suited for some applications requiring high speed response and a high degree of stability.

FIG. 1 of the accompanying drawings is a block diagram showing the conventional PLL circuit. The circuit includes a phase detector 1 (hereinafter referred to as PD); a low pass filter 2 (hereinafter referred to as LPF) serving as a loop filter for the PLL circuit; a voltage controlled oscillator 3 (hereinafter referred to as VCO); an 1/n frequency divider 4; and an input terminal 5 to which an incoming signal is supplied. The phase detector 1 can generally be classified as either an analog type or a digital type. The PLL circuit is also classified either as an analog or digital type, depending on the type of phase detector used.

FIG. 2 shows by way of example the arrangement of the essential parts of the conventional analog type PLL circuit. FIG. 2 includes a wave-form shaping circuit 6 and a multiplier circuit 7 which jointly form a phase detector such as the phase detector (PD) 1 shown in FIG. 1. An LPF 2a corresponds to the LPF 2 of FIG. 1. A terminal 8 receives a phase detecting square wave produced from the 1/n frequency divider 4 of FIG. 1 for phase detection. A terminal 9 corresponds to the terminal 5 of FIG. 1 and receives a square wave signal (such as the horizontal synchronizing signal of a television signal) as an external incoming signal in the form of pulses of a narrow width not exceeding a duty cycle of 50%. A terminal 10 supplies an output signal to the VCO 3 of FIG. 1. Another terminal Vcc is arranged to have a power supply voltage impressed thereon. A terminal VB is arranged to have a bias voltage impressed thereon.

FIG. 3 is a timing chart showing the wave forms of the various parts (a)–(e) shown in FIG. 2. In operation, the phase detecting square wave (a) produced from the 1/n frequency divider 4 is converted into a saw tooth wave (b) by the wave-form shaping circuit 6 composed of an RC passive element. The saw tooth wave (b) is supplied to the multiplier 7. The external incoming square wave signal (c) is supplied to the input terminal 9. At the multiplier 7, a part of the saw tooth wave (b) is extracted by the incoming external square wave signal (c) through a multiplying operation, as shown at (d) in FIG. 3.

An LPF 2a which serves as a loop filter and is composed of a resistor R and capacitor C is arranged to pass only a low frequency component of the extracted signal (d). The low frequency component corresponds to a phase difference between the incoming external signal (c) and the phase detecting square wave (a). The signal (d) is then controlled by a control signal (e) to increase the oscillation frequency of the VCO 3 when the oscillation phase of the VCO 3 is delayed and to decrease it when the phase is ahead of the correct phase. The VCO 3 is thus controlled to decrease the phase error until a phase locked state is obtained.

In the analog PLL circuit arranged as described above, the VCO is controlled throughout the whole period of operation. However, since the detection of phase deviation is carried out in a predetermined cycle, a certain length of time is required before information on phase deviation is reflected in control over the VCO. This results from the fact that the response speed of the whole PLL circuit is determined by that of the LPF 2a. The responsivity of the LPF 2a thus makes it difficult to obtain a high speed responsive PLL circuit. Assuming that the frequency of the incoming external square wave signal is 15.374 KHz (the horizontal synchronizing frequency of a television signal), the LPF 2a must adequately remove the 15.734 KHz component and the components related thereto from the output of the multiplier 7. To meet this requirement, the cut-off frequency of the LPF 2a in general must be set at several hundred Hz. This requirement has prevented the LPF 2a from having a quick response.

In an analog PLL circuit of this type, it is conceivable to attenuate the frequency component of the incoming external square wave signal by sample-and-holding the output of the multiplier 7. Even in that event, however, an LPF is indispensable. Besides, assuming that the frequency of the incoming external square wave signal is fr, the sample-and-holding operation results in a wasted time of 1/fr sec (63.556μ sec where fr=15.734 KHz). This causes some degradation of the frequency characteristic. Therefore, no substantial improvement can be expected from such an arrangement. Further, the stability of the PLL circuit is impaired by a phase delay resulting from the operations of an LPF and a sample-and-holding arrangement.

FIG. 4 shows by way of example the arrangement of the conventional digital PLL circuit. In FIG. 4, the same component elements as those shown in FIG. 1 are indicated by the same reference numerals and symbols. An AND gate 11 and an LPF 2b correspond, respectively, to the PD and to the LPF of FIG. 1. FIGS. 5(A), 5(B), and 5(C) are timing charts of the wave forms of the various parts (a)–(d) shown in FIG. 4.

FIG. 5(A) shows the PLL circuit of FIG. 4 in a phase locked state. FIG. 5(B) shows it in a state wherein the output (b) of the frequency divider 4 has for some reason gained in phase and ends up ahead of the incoming external square wave signal (a). As apparent from the drawing, when the phase of the signal produced from the frequency divider 4 gains, that is, when the phase of the oscillation signal of the VCO 3 gains, the pulse width of the pulses (c) produced from the AND gate 11 become narrower than the width obtained at the time of phase lock. The control voltage (d) supplied to the VCO 3 thus decreases. Accordingly, the oscillation frequency of the VCO 3 decreases and the phase of the oscillation signal from the VCO 3 is delayed. As a result, the PLL circuit is pulled into a phae-:locked state as shown in FIG. 5(A). FIG. 5(C) shows a state wherein the phase of the signal produced from the frequency divider 4 is lagging behind that of the incoming external square wave signal (a). Again, as apparent from the drawing, the pulse width of the pulses (c) produced from the AND gate 11 becomes wider than the width obtained at the time of phase lock and the control voltage supplied to the VCO 3 increases. The oscillation frequency of the VCO 3, therefore, also increases and advances the phase of the oscillation signal of the VCO 3. The PLL circuit is thus pulled into a phase locked state.

In the digital PLL circuit described above, the VCO is controlled throughout the entire period of operation. The conventional digital PLL circuit thus necessitates the use of some smoothing element such as an LPF. Therefore, the digital PLL circuit also brings about some response delay in the same manner as in the analog type PLL circuit previously described. It has thus been extremely difficult to obtain a quick response PLL circuit. Moreover, the stability of the operation of the conventional PLL circuit is impaired by the response delay.

SUMMARY OF THE INVENTION

It is an object of the present invention to provide a PLL circuit which is quickly responsive and highly stable and is capable of solving the problems of the conventional PLL circuits in respect to a high speed of respectivity and a high degree of stability.

It is another object of the invention to provide a PLL circuit which dispenses with any loop filter.

It is a further object of the invention to provide a PLL circuit which is capable of obtaining the same loop gain for all the bands.

It is still further object of the invention to provide a PLL circuit which has no transient response.

To achieve these objects, a phase-locked loop circuit embodying an aspect of this invention comprises a controllable oscillator; a phase detecting circuit to produce a control signal for controlling the oscillation frequency of the oscillator according to a phase difference between the output of the oscillator and an incoming signal; and a designating circuit for designating a specific period of time during which the oscillator is substantially controlled by the control signal.

These and further objects and features of the invention will become apparent from the following detailed description of the embodiments thereof taken in connection with the accompanying drawings.

DETAILED DESCRIPTION OF THE PREFERRED EMBODIMENTS

Figure 1:
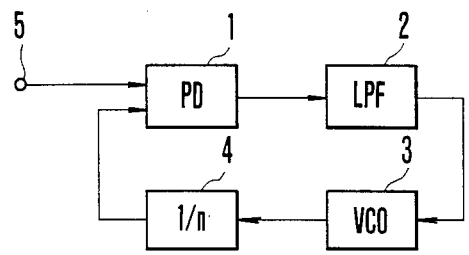
FIG. 1 is a block diagram showing the arrangement of the conventional PLL circuit as generally practiced.
Figure 2:
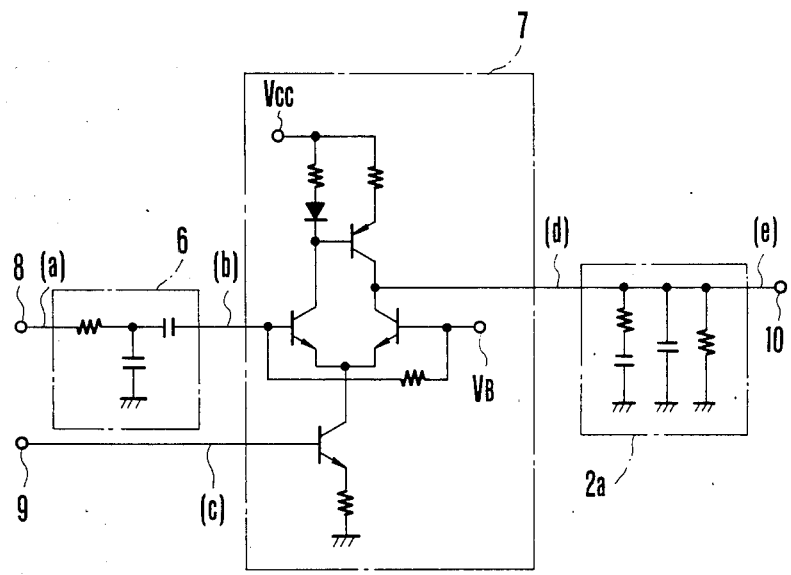
FIG. 2 is a circuit diagam showing an example of the conventional analog type PLL circuit.
Figure 3:
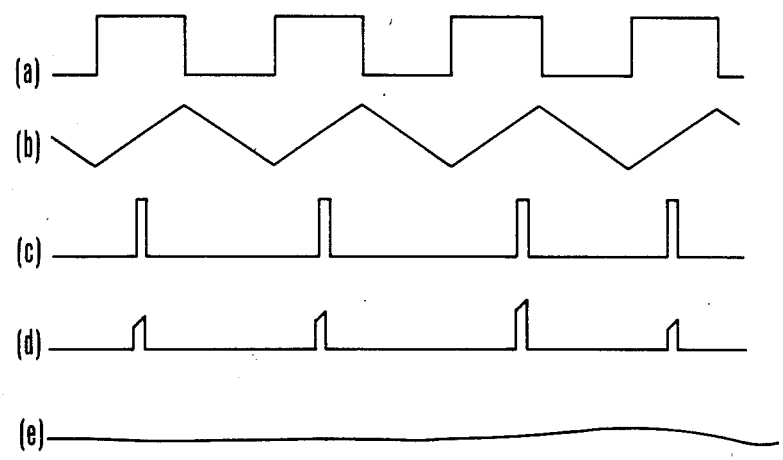
FIG. 3 is a timing chart showing the wave forms of the various parts (a)-(e) indicated in FIG. 2.
Figure 4:
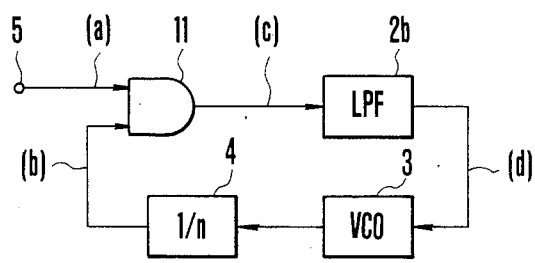
FIG. 4 is a circuit diagram showing an example of the conventional digital type PLL circuit.
Figures 5A, 5B, 5C:
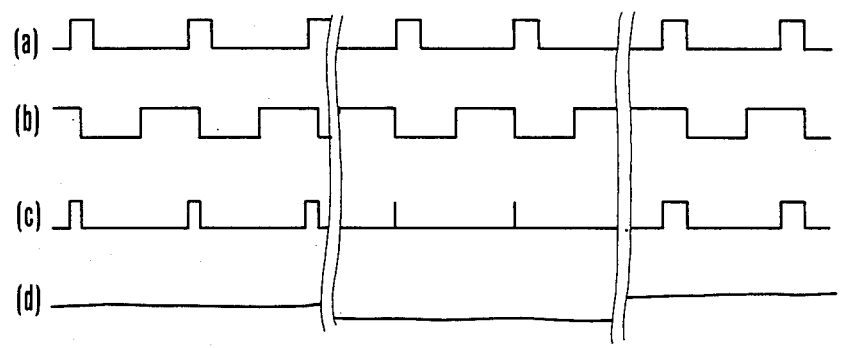
FIGS. 5(A), 5(B) and 5(C) show in a timing chart the wave forms of the various parts of FIG. 4.
Figure 6:
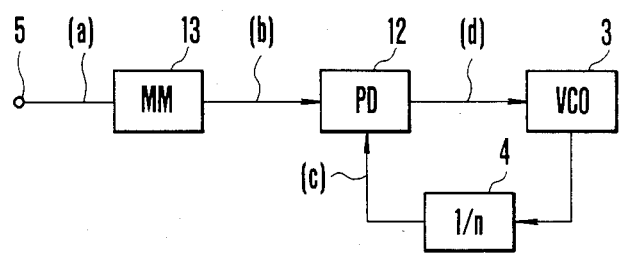
FIG. 6 is a block diagram showing the arrangement of a PLL circuit as an embodiment of the present invention.

Referring to FIG. 6 which shows the arrangement of a PLL circuit as an embodiment of the present invention, the embodiment includes a VCO 3; a frequency divider 4; an input terminal 5 arranged to receive an incoming external square wave signal; a PD 12 which is capable of producing its outputs at three different levels including a high level, a low level and an intermediate level; and a monostable multivibrator (hereinafter referred to as MM). FIGS. 7(A), 7(B) and 7(C) show in a timing chart the wave forms of the various parts (a)-(d) shown in FIG. 6. The operation of the embodiment is as follows:

The incoming external square wave signal (a) comes via the terminal 5 to be impressed on the MM 13. The MM 13 then supplies pulses of the pulse width TW to the PD 12. To the other input terminal of the PD 12 is supplied the output (c) of the frequency divider 4, which is obtained by counting down the oscillation output of the VCO 3 to 1/n and supplied as a comparison signal. The PD 12 then compares the phases of these inputs to each other. In operation, PD 12 produces either a high level outut VH or a low level output VL only when the output of the MM 13 is at a high level and produces an intermediate level output VM when the output of the MM 13 is at a low level. Further, when the output of the MM 13 is at the high level, that is, during the period of the pulse width TW, the PD 12 produces the output VL when the output of the frequency divider 4 is at a high level and the output VH when the output of the frequency divider 4 is at a low level. The output (d) of the PD 12 is supplied directly to the VCO 3. The VCO 3 then produces one of three oscillation outputs of different frequencies FL, FM and FH according to one of the three different output levels VL, VM and VH of the PD 12.

The oscillation output is supplied to the 1/n frequency divider 4 and is frequency divided to 1/n. The frequency divided output is then supplied to the comparison input terminal of the PD 12. A closed loop is thus formed.

Assuming that the phase of the signal thus produced from the frequency divider 4 is delayed for some reason compared with that of the incoming external square wave signal, the length of time TH for which the PD 12 produces the output VH within the period TW becomes longer than the length of time TL for which the PD produces the output VL, as shown in FIG. 7(B). Accordingly, the VCO 3 then comes to oscillate at the frequency FH for a longer period of time than at the frequency FL. Therefore, in that event the phase of the signal produced from the frequency divider 4 is controlled to advance.

Meanwhile, with the phase of the signal produced from the frequency divider 4 gaining as compared with the incoming external square wave signal, the length of time for the output TL of the PD 12 becomes longer than the length of time for the output TH within the period TW, as shown in FIG. 7(C). The VCO 3, therefore, oscillates at the frequency FL for a longer period than at the frequency FH. Accordingly, in this event, the phase of the signal produced from the frequency divider 4 is controlled to be retarded.

During a period other than the period TW, the PD 12 produces the output VM and the VCO 3 oscillates at the frequency FM. The frequency divider 4 is a 1/n frequency divider. Therefore, assuming that the frequency of the incoming external square wave signal is FR, the oscillation frequency FM of the VCO 3 is arranged to be nFR. During a period other than the period TW, therefore, the VCO 3 is virtualy free from control. The frequency FH is higher and the frequency FL lower than the frequency FM.

Referring to FIG. 7(A), with the PLL circuit brought into a phase-locked state by the operation described above, the length of time TH and TL both become $\frac{1}{2}$ TW to keep the PLL circuit in the phase-locked state. A negative feedback PLL is formed with the ratio of the length of time TH to the length of time TL controlled as mentioned above under the conditions of $TH+TL=TW$. An analysis of the above-stated operation of the PLL circuit follows:

Assuming that the voltage-frequency characteristic of the VCO 3 is $$F = kV \qquad (1)$$

The following relation is obtained:

$$\left.\begin{array}{l} FH = kVH \\ FL = kVL \\ FM = kVM \end{array}\right\} \qquad (2)$$

Further, assuming that, when the different signal output levels of the PD 12 are VH, VL and VM, the periods of the oscillation signal outputs of the VCO 3 are $\rho H$, $\rho L$ and $\rho M$ respectively, the following relation is obtained:

$$\left.\begin{array}{l} \tau H = 1/FH \\ \tau L = 1/FL \\ \tau M = 1/FM \end{array}\right\} \qquad (3)$$

Assuming that a period of time which corresponds to the generating period of the incoming external square wave signal is TO as shown in FIG. 7(A), a period of time during which the signal output level of the PD 12 is VM, is TM and the number of pulses generated by the VCO 3 within the lengths of time TH, TL and TM while the PLL circuit is phased locked are respectively l, h and m, since $TH=TL=TW/2$ while the PLL circuit is phased locked, the following relation is obtained:

$$\left.\begin{array}{l} l = \dfrac{TW}{2} FL = \dfrac{TW}{2\tau L} \\ h = \dfrac{TW}{2} FH = \dfrac{TW}{2\tau H} \\ m = (TH - TW) FM = \dfrac{TH - TW}{\tau M} \end{array}\right\} \qquad (4)$$

wherein: $l + h + m = n$ (5)

Further, assuming that the number of pulses produced from the VCO 3 within the lengths of time TH, TL and TM become l', h' and m' respectively when the phase of the signal output of the frequency divider 4 gains as much as $\Delta t$ with the PLL circuit deviating from the phase-locked state, the following relation is obtained:

$$\left.\begin{array}{l} l' = \left(\dfrac{TW}{2} + \Delta t\right) FL = l + \Delta tFL \\ h' = \left(\dfrac{TW}{2} - \Delta t\right) FH = h - \Delta tFH \\ m' = n - l' - h' \end{array}\right\} \qquad (6)$$

In that instance, a period of time TO' corresponding to the period of the signal output of the frequency divider 4 can be expressed as follows:

$$TO' = l'\tau L + h'\tau H + m'\tau M \qquad (7)$$

Substituting Formula (6) into Formula (7) above and using the relation of Formula (3), the following relation is obtained:

$$TO' = (l + \Delta tFL)\tau L + (h - \Delta tFH)\tau H + \qquad (8)$$
$$\{n - (l + \Delta tFL) - (h - \Delta tFH)\}\tau M$$
$$= l\tau L + h\tau H + (n - l - h)\tau M +$$
$$\Delta tFL\tau L - \Delta tFH\tau H - \Delta tFL\tau M + \Delta tFH\tau M$$

Since $$l\rho L + h\rho H + m\rho M = TO \qquad (9)$$

the following relation is obtained:

$$TO' = TO + \Delta t\rho M(FH - FL) \qquad (10)$$

Then, Formula (10) can be re-arranged as follows:

$$TO' - TO = \Delta t \dfrac{FH - FL}{FM} \qquad (11)$$

Since the period of time TO corresponds to the period of the signal output of the frequency divider 4 produced while the PLL circuit is in a phase-locked state, a time base loop gain GT can be expressed, from Formula (11), as follows:

$$GT = \dfrac{TH' - TH}{\Delta t} = \dfrac{FH - FL}{FM} \qquad (12)$$

Then, a time base dynamic range DT can be expressed as follows:

$$DT = \dfrac{FH - FL}{FM} \cdot \dfrac{TW}{2} \text{ (sec)} \qquad (13)$$

Figure 8:
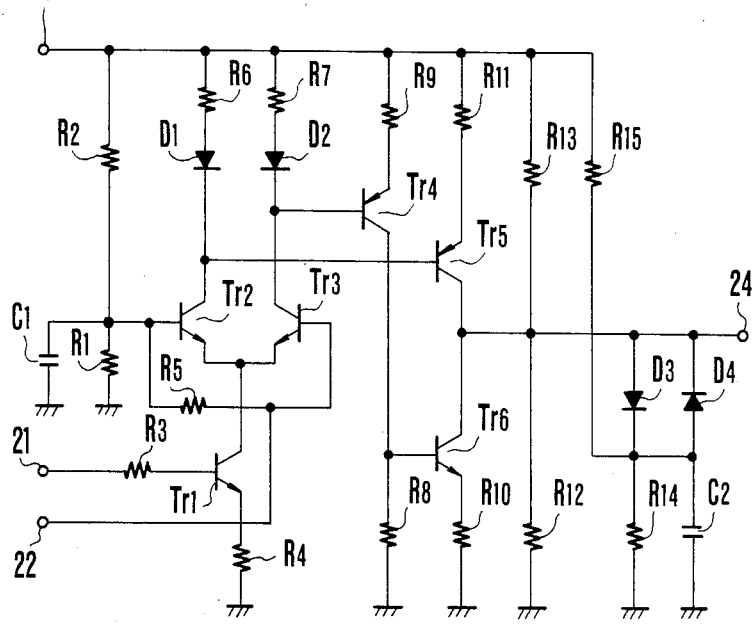
FIG. 8 is a circuit diagram showing, by way of example, a specific circuit arrangement of a PD shown in FIG. 6.

The loop gain can be arranged to be as large as desired by increasing the value of $FH - FL$. However, preferred practical values of these frequencies are:

FM=4 MHz, FL=1 MHz and FH=7 MHz or thereabout. In that instance, the loop gain is 1.5. A specific circuit arrangement example of the PLL circuit shown in FIG. 6, and arranged to operate as described above, will now be described:

Referring to FIG. 8, which shows the specific circuit arrangement of the PD 12 of FIG. 6, the PD 12 includes resistors R1-R15; capacitors C1 and C2; diodes D1-D4; transistors Tr1-Tr6; a terminal 21 which is arranged to receive the signal output of the MM 13 of FIG. 6; a terminal 22 which is arranged to receive the output of the frequency divider 4; a terminal 23 which receives a power supply voltage Vcc; and another terminal 24 which is arranged to produce therefrom a control voltage to be supplied to the VCO 3.

With the PD 12 arranged in this manner, when the output of the MM 13 is at a low level, both the transistors Tr2 and Tr3 turn off as the transistor Tr1 turns off. Accordingly, the other transistors Tr4, Tr5 and Tr6 also turn off. Assuming that all the resistors R12-R15 are of the same resistance value, the voltage produced from the terminal 24 is $\frac{1}{2}$ Vcc. Where the output of the MM 13 is at a high level and the output level of the frequency divider 4 is also high, the transistors Tr1 and Tr3 turn on. Accordingly, the transistor Tr4 also turns on. This causes the transistor Tr6 to turn on. Meanwhile, since the transistor Tr2 is off, the transistor Tr5 turns off. Therefore, the terminal 24 produces a voltage which is at a lower level than the above-stated voltage of $\frac{1}{2}$ Vcc. In this instance, however, the output voltage of the terminal 24 becomes $\frac{1}{2}$ Vcc $-$ VD4 (wherein VD4 represents the forward voltage of the diode D4) because the amplitude of the voltage is limited by a limiter formed jointly by the diodes D3 and D4, resistors R14 and R15 and capacitor C5. Where the output of the frequency divider 4 is at a low level while the output level of the MM 13 is high, the transistors Tr1 and Tr2 turn on and the transistor Tr3 turns off. Then, the transistor Tr5 turns on and the transistor Tr6 turns off. As a result of this, the terminal 24 produces a voltage which is at a higher level than the above-stated voltage of $\frac{1}{2}$ Vcc. However, since the above-stated limiter also limits the amplitude thereof, the voltage output of the terminal 24 becomes $\frac{1}{2}$ Vcc+VD3, wherein VD3 represents the forward voltage of the diode D3.

With the resistance values of the resistors R10-R15 and the forward voltage values of the diodes D3 and D4 suitably determined in the circuit arrangement as shown in FIG. 8, the PD indicated in FIG. 6 is capable of producing its outputs VH, VM and VL at three different levels as previously mentioned.

Figure 7:
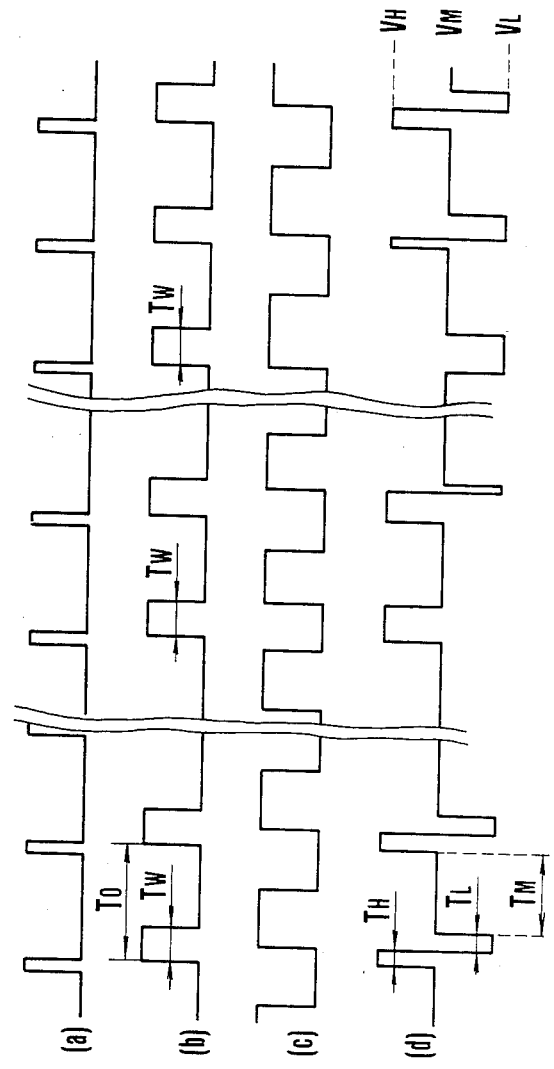
FIGS. 7(A), 7(B) and 7(C) show in a timing chart wave forms of the various parts of FIG. 6.

In the PLL circuit which is arranged as an embodiment of the invention as shown in FIGS. 6, 7 and 8, the VCO 3 within the loop is controlled solely during the period of time TW and is virtually allowed to operate freely (at oscillation frequency FM) during the rest of the period. TO-TW. Therefore, the apparent wasted time of the loop is limited to the period of time TW. Compared with the conventional analog PLL circuit which performs a sample-and-holding operation by sampling at the period TO, this embodiment reduces the wasted time to TW/TO and thus has an extremely high speed of responsivity.

Further, since no LPF is included in the loop, the responding speed of the embodiment will never be limited by the use of an LPF. Accordingly, there is no limit with respect to the frequency band. Therefore, about the same loop gain can be obtained at almost any band. Since there is no transient response, the PLL circuit operates at a high degree of stability as no PLL noise such as overshooting arises after attainment of a phase locked state.

Figure 9:
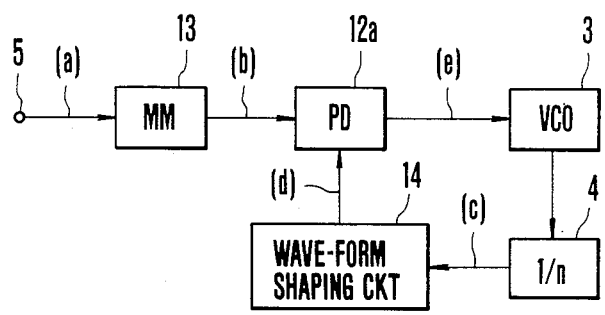
FIG. 9 is a block diagram showing the arrangement of a PLL circuit as another embodiment of the invention.

FIG. 9 is a block diagram showing the arrangement of a PLL circuit as another embodiment of the invention. In FIG. 9, the same component elements as those shown in FIG. 6 are indicated by the same reference numerals and symbols. This embodiment includes a wave-form shaping circuit 14 and a PD 12a. The PD 12a is arranged to produce an output corresponding to the wave form of the output of the shaping circuit 14 only when the output of the MM 13 is at a high level. In the event of a low output level of the MM 13, the PD 12a produces an output VM which allows the VCO to operate freely at around its center frequency.

FIGS. 10(A), 10(B) and 10(C) show in a timing chart the wave forms of the various parts (a)-(e) indicated in FIG. 9. The operation of this embodiment will be described below with reference to the timing chart.

The shaping circuit 14 transforms the output (c) of the frequency divider 4 into a saw tooth wave (d). When the output (b) of the MM 13 is at a high level, a saw tooth shaped wave (e) is produced as shown in FIGS. 10(A), 10(B) and 10(C).

In the event that the phase of the signal output of the frequency divider 4 is delayed with reference to the incoming external square wave signal (or the signal output of the MM 13), the PD 12a produces an output which makes the oscillation frequency of the VCO 3 higher when the output level of the MM 13 is high. This output of the PD 12a then serves to advance the phase of the signal output of the frequency divider 4. Where the phase of the signal output of the frequency divider 4 gains, thus becoming ahead of the phase of the incoming external square wave signal, the output level of the PD 12a becomes lower than the voltage VM to lower the oscillation frequency of the VCO 3 when the output of the MM 13 is at a high level. The output of the PD 12a thus serves to retard the phase of the signal output of the frequency divider 4 as shown in FIG. 10(C).

The embodiment thus brings about a phase-locked state as shown in FIG. 10(A). An example of the detailed circuit arrangement of the shaping circuit 14 and the PD 12a is as shown in FIG. 11. The circuit arrangement shown in FIG. 11 includes a terminal 21' which is arranged to receive the signal output of the MM 13; a terminal 22' which is arranged to receive the signal output of the frequency divider 4; a terminal 23' to which a power supply voltage Vcc is supplied; and another terminal 24' which is arranged to supply a control signal to the VCO 3. The circuit arrangement further includes resistors R20-R22; capacitors C10 and C11; and an analog switch 25. The output (c) of the frequency divider 4 is transformed into the wave form (d) as shown in FIGS. 10(A), 10(B) and 10(C) by a shaping circuit which is formed by the capacitors C10 and C11 and the resistor R20. The transformed wave form output (d) of the shaping circuit is supplied to the terminal 24' via the analog switch 25 only when the output of the MM 13 is at a high level. Where the output of the MM 13 is at a low level and the analog switch 25 is off, the terminal 24' produces an output at a level obtained by voltage dividing the power supply voltage Vcc by the resistors R21 and R22.

Figure 10:
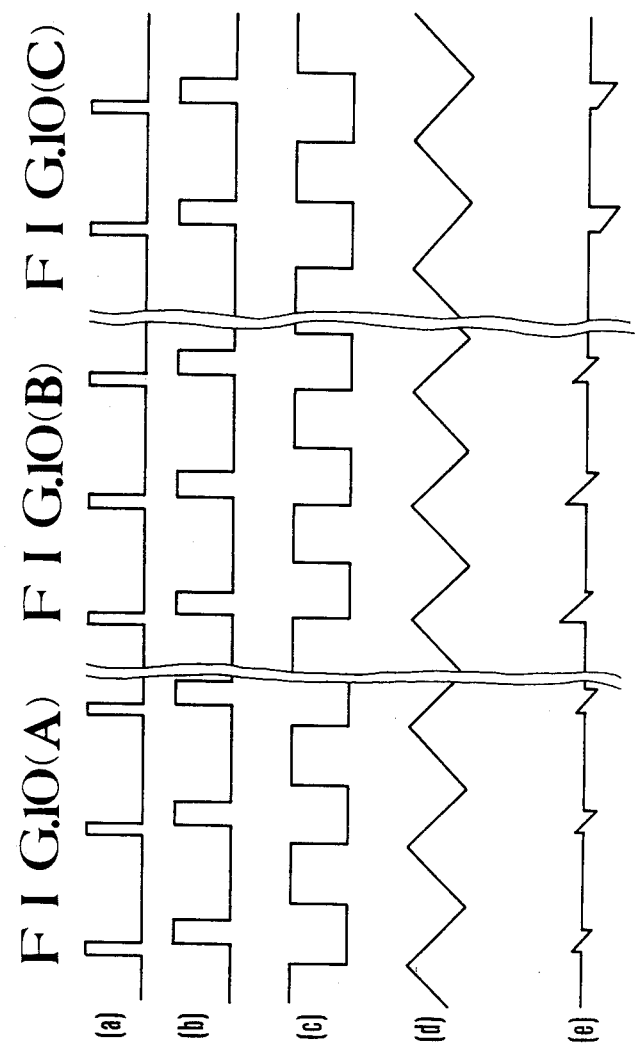
FIGS. 10(A), 10(B) and 10(C) show in a timing chart the wave forms of the various parts of FIG. 9.
Figure 11:
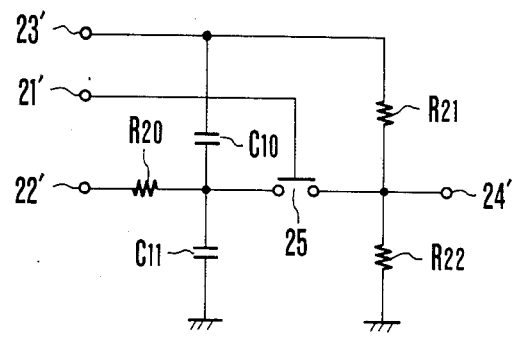
FIG. 11 is a circuit diagram showing, by way of example, a specific circuit arrangement of an essential part of FIG. 9.

In the PLL circuit of the embodiment of FIGS. 9, 10 and 11, the VCO 3 is placed under control also only for a predetermined length of time set by the MM 13 and is allowed virtually to operate freely during the rest of the period. Further, the degree of phase deviation is represented by the level of the signal output of the PD 12a obtained when the output level of the MM 13 is high. Therefore, the wasted time of the loop is reduced to permit a high speed response. Further, the arrangement of the embodiment obviates the necessity to use a loop LPF. This embodiment thus has the same advantages as the embodiment of FIG. 6.

Further, in the embodiment of FIGS. 9, 10 and 11, the arrangement of the PD 12a may be replaced with a modification in which the output of the shaping circuit 14 is sampled and held by a sample-and-hold circuit arranged to be triggered by a rise of the output of the MM 13 and reset by a fall thereof. In that instance, the level of the signal output of the shaping circuit 14 which is obtained at the rise of the output of the MM 13 is held while the output of the MM 13 stays at a high level.

In the two embodiments thus far given, the length or span of time to be set by the MM 13 is not arranged to vary. However, this span of time may be arranged to become wider for a larger dynamic range under a transient condition before the PLL circuit is phase locked and to become narrower for a high speed responsivity after the PLL circuit is phase-locked.

Figure 12:
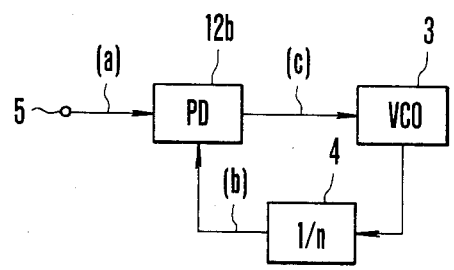
FIG. 12 is a block diagram showing the arrangement of a PLL circuit as a further embodiment of the invention.
Figures 13A, 13B, 13C:
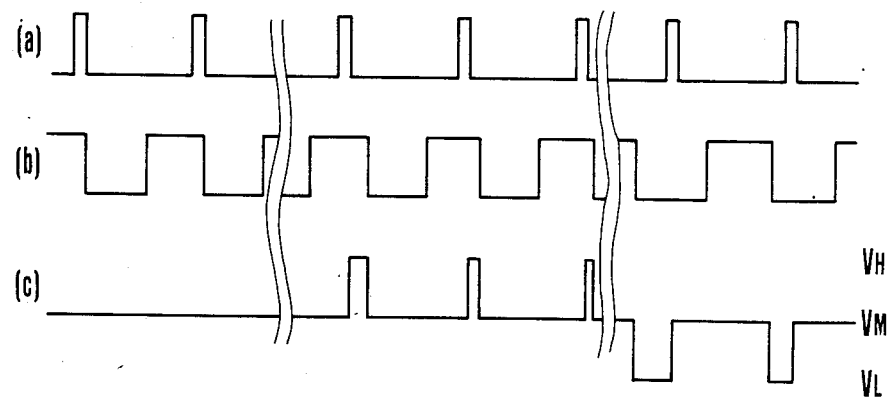
FIGS. 13(A), 13(B) and 13(C) show in a timing chart the wave forms of the various parts of FIG. 12.

FIG. 12 shows in a block diagram the arrangement of a further embodiment of the invention. In this drawing, the same component elements as those shown in FIG. 6 are indicated by the same reference numerals and symbols. This embodiment is provided with a PD 12b whose arrangement will now be described. The phase detector 12b (PD) produces its output at a level VH for a period of time corresponding to the extent to which the phase of the signal output of the frequency divider 4 is ahead of that of the incoming external square wave signal when the former is ahead of the latter. Where the former is behind the latter, the PD 12b produces its output at a level VL for a period of time corresponding to the extent to which the former is delayed. The PD 12b produces its output at another level VM when it produces its output neither at the level VH nor at the level VL. FIGS. 13(A), 13(B) and 13(C) show the wave forms of the various parts (a)-(c) indicated in FIG. 12. The operation of this embodiment will now be described with reference to FIGS. 13(A), 13(B) and 13(C). As shown in FIG. 13(A), the output of the PD 12b is always at a level VM as long as the fall of the signal output (b) of the frequency divider 4 coincides with that of the incoming external square wave signal (a). In this instance, the VCO 3 oscillates at around the center frequency thereof and a phase-locked state is obtained. Where the drops off of the signal output (b) is delayed and is behind that of the incoming external square wave signal (a), the output of the PD 12b changes from the level VM to VH concurrently with the drops off of the incoming external square wave signal (a) and comes back to the level VM concurrently with the drop off of the signal output (b) of the frequency divider 4 as shown in FIG. 13(B). The PD 12b thus produces its output at the level VH for a period of time corresponding to the phase delay of the signal output (b) of the frequency divider 4 relative to the incoming external square wave signal (a). During that period, the VCO 3 oscillates at a predetermined frequency FH which is higher than the center frequency thereof. This causes the phase of the signal output (b) of the frequency divider 4 to advance thus bringing about a phase-locked state in which the drop offs of the two signals coincide with each other as shown in FIG. 13(A).

In the event that the drop off of the signal output (b) of the frequency divider 4 takes place ahead of the drop off of the incoming external square wave signal (a) as shown in FIG. 13(C), the output of the PD 12b changes from the level VM to the level VL concurrently with the drop off of the signal output (b) of the frequency divider 4 and comes back to the level VM concurrently with the drop off of the incoming external square wave signal (a). In that event, the PD 12b produces its output at the level VL for a period of time corresponding to the extent to which the phase of the signal output (b) of the frequency divider 4 is ahead of the signal (a). During this period, therefore, the VCO 3 oscillates at a predetermined frequency FL which is lower than the center frequency thereof. Accordingly, the phase of the signal output (b) of the frequency divider 4 is retarded to bring about the phase-locked state as shown in FIG. 13(A).

Figure 14:
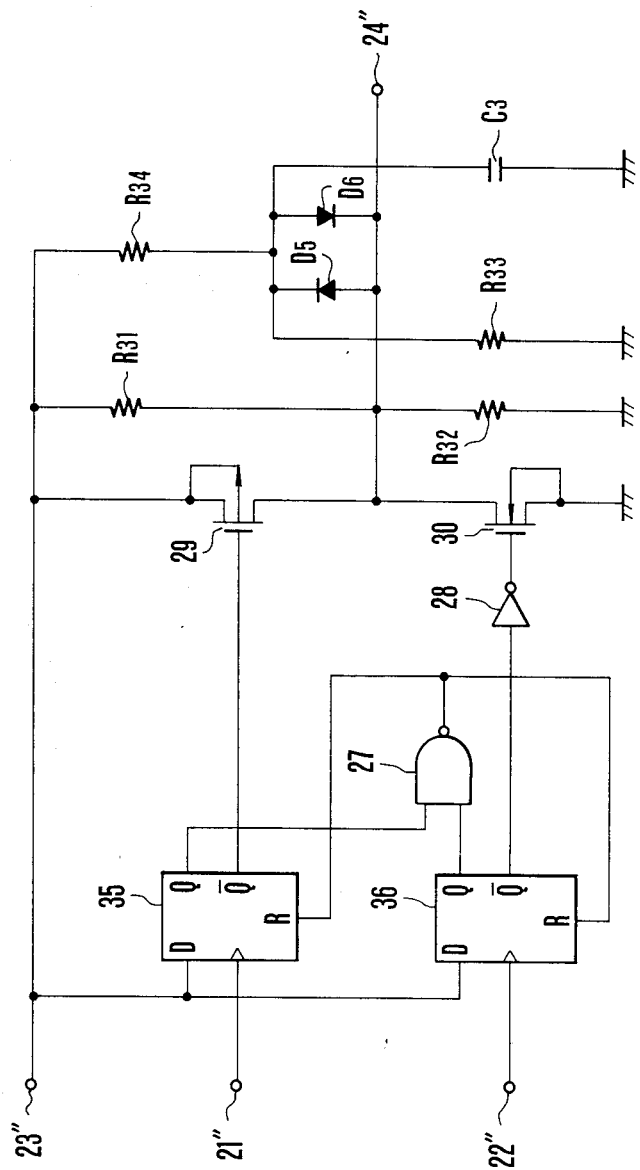
FIG. 14 is a circuit diagram showing, by way of example, a specific circuit arrangement for a PD shown in FIG. 12.

FIG. 14 shows by way of example the details of the circuit arrangement of the PD 12b of the embodiment which operates in the manner as described above. Referring to FIG. 14, the circuit arrangement of the PD 12b includes a terminal 21'' which is arranged to receive the incoming external square wave signal; a terminal 22'' which receives the signal output of the frequency divider 4; a terminal 23'' which receives the power supply voltage Vcc; a terminal 24'' which is arranged to produce a control signal for controlling the VCO; D type flip-flops 35 and 36 (hereinafter referred to as DFF's); a NAND gate 27; an inverter 28; MOS-FET's 29 and 30; resistors R31-R34; a capacitor C3; and diodes D5 and D6. The PD operates as follows:

First, where the phase of the signal output (b) of the frequency divider 4 comes ahead of the incoming external square wave signal (a), the DFF 36 is triggered by the falling edge of the signal output of the frequency divider 4. The level of the output Q of the DFF 36 becomes high and that of the output $\overline{Q}$ thereof low. The output $\overline{Q}$ is inverted by the inverter 28 and is impressed on the MOS-FET 30. This causes the MOS-FET 30 to turn on. As a result, a low level output is obtained from the terminal 24''. However, due to a restricting action of a limiter formed by the resistors R33 and R34, the capacitor C3 and the diodes D5 and D6, the output voltage becomes a voltage which is lower by a value of VD6 (which is the forward voltage of the diode D6) than a voltage determined by the resistors R33 and R34. For example, where the resistors R33 and R34 are of the same resistance value, the output voltage thus obtained becomes ½ Vcc−VD6. After this, the DFF 35 is triggered by the falling edge of the incoming external square wave signal. The level of the output Q of the DFF 35 then becomes high. At that instant, the levels of two inputs of the NAND circuit 27 become high. Both the DFF's 35 and 36 are, therefore, reset. The MOS-FET 30 then turns off and comes back to the original state. As a result, the output voltage comes back to the voltage determined by the resistors R31 and R32.

Where the phase of the signal output (b) is retarded and becomes behind that of the incoming external square wave signal (a), the DFF 35 is first triggered by the falling edge of the incoming external square wave signal (a). The level of the output $\overline{Q}$ of the DFF 35 becomes low. Then, the MOS-FET 29 turns on. In this instance, the output voltage produced from the terminal 24'' becomes higher by a voltage value of VD5 (which is the forward voltage of the diode D5) than the voltage determined by the resistors R33 and R34. Following this, the DFF 36 is triggered by the falling edge of the signal output (b) of the frequency divider 4. The levels of two inputs of the NAND circuit 27 then become high to reset the DFF's 35 and 36. This brings the output voltage back to the voltage determined by the resistors R31 and R32.

The circuit arrangement shown in FIG. 14 thus enables the PD to perform the operation in the manner previously described. In other words, the PD is capable of producing its output at one of three different levels VH, VM and VL according to the degree of phase deviation with the resistance values of the resistors R31–R34 arranged to be suitable values.

The embodiment of FIGS. 12, 13 and 14 also gives the same advantageous effects as those of the preceding embodiments of FIGS. 6, 7 and 8. Further, in the case of this embodiment, a greater dynamic range can be obtained than in the case of the preceding embodiment. Besides, since the period during which the output of the PD is produced at the level VH or VL, becomes shorter, the wasted time becomes shorter in order to give a higher speed responsivity. In other words, the PLL circuit has a larger dynamic range under a transient condition and becomes responsive at a higher speed after a phase-locked state is obtained.

What is claimed is:

1. A phase-locked loop circuit, comprising:
   (a) a controllable oscillator having an oscillation frequency;
   (b) a phase detecting means arranged to generate a control signal for controlling the oscillation frequency of said oscillator according to a phase different between an output of said oscillator and an incoming signal; and
   (c) designating means connected with said phase detecting means for designating a specific period of time during which said oscillator is substantially controlled by the control signal at every repeating period of said incoming signal.

2. A circuit according to claim 1, wherein said designating means is arranged to generate a periodic signal which includes information on the phase of said incoming signal and designates said specific period; and said periodic signal is arranged to be supplied to said phase detecting means.

3. A phase-locked loop circuit, comprising:
   (a) a controllable oscillator having an oscillation frequency;
   (b) a phase detecting means arranged to generate a control signal for controlling the oscillation frequency of said oscillator according to a phase difference between an output of said oscillator and an incoming signal; and
   (c) designating means connected with said phase detecting means for designating a specific period of time during which said oscillator is substantially controlled by the control signal;
   said control signal is produced at a first level for allowing said oscillator to oscillate at a center frequency of said oscillator during a period other than said specific period.

4. A circuit according to claim 3, wherein, during said specific period, said control signal is produced either at a second level for causing said oscillator to oscillate at a predetermined frequency higher than said center frequency or at a third level for causing said oscillator to oscillate at another predetermined frequency than said center frequency.

5. A circuit according to claim 3, wherein said phase detecting means includes a circuit for generating a triangular wave in synchronism with the output of said oscillator; and, during said specific period, said control signal is produced at a level corresponding to a level of said triangular wave.

6. A phase-locked loop circuit, comprising:
   (a) a controllable oscillator having a predetermined center frequency and generating an output;
   (b) pulse signal generating means for generating a pulse signal having a phase synchronized with a phase of an incoming signal;
   (c) a frequency divider arranged to frequency divide the output of said oscillator; and
   (d) phase detecting means arranged to compare the phase of said pulse signal with a phase of said frequency divider and to generate a control signal for controlling an oscillation frequency of said oscillator according to a phase difference between them, said control signal being arranged to be a signal corresponding to said phase difference solely during a period of time corresponding to a pulse width of said pulse signal and to be produced at a level for allowing said oscillator to operate freely at the predetermined center frequency during a period other than said period corresponding to said pulse width.

7. A circuit according to claim 6, wherein, during said period corresponding to said pulse width, said control signal is produced either at a first control level causing said oscillator to oscillate at a predetermined frequency higher than said predetermined center frequency or at a second control level causing said oscillator to oscillate at another predetermined frequency lower than said predetermined center frequency; and wherein the ratio of a length of time during which the control signal is at the first control level to a length of time during which the control signal is at the second control level is determined by said phase difference.

8. A circuit according to claim 7, wherein, when said phase difference is zero, the length of time said control signal is at said first level is equal to the length of time the control signal is at said second level within said period of time corresponding to said pulse width.

9. A circuit according to claim 6, wherein an average level of said control signal during said period of time corresponding to said pulse width is determined according to said phase difference.

10. A circuit according to claim 9, wherein said phase detecting means includes a circuit for generating a triangular wave synchronized with the output of said frequency divider; and said control signal is at a level corresponding to said triangular wave during the period of time corresponding to said pulse width.

11. A phase-locked loop circuit, comprising:
   (a) a controllable oscillator having a predetermined center frequency and generating an output; and
   (b) phase detecting means for controlling an oscillation frequency of said oscillator according to a phase difference between an incoming signal and the output of said oscillator, said phase detecting means being arranged to be capable of setting the oscillation frequency of said oscillator only at the center frequency of the oscillator, at a single first frequency which is higher than the center frequency or at a single second frequency which is lower than the center frequency.

12. A circuit according to claim 11, wherein said center frequency is an intermediate frequency between said first and second frequencies.

13. A circuit according to claim 12, wherein a first, second or third period during which said oscillator oscillates at said first, second or intermediate frequency is determined according to said phase difference.

14. A circuit according to claim 13, wherein said third period is determined irrespective of said phase difference.

15. A circuit according to claim 14, wherein said first and second periods are of the same length of time when said phase difference is zero.

16. A circuit according to claim 13, wherein said second period is zero when a phase of said incoming signal is ahead of a phase of the output of said oscillator; and said first period is zero when the phase of the output of said oscillator is ahead of the phase of said incoming signal.

17. A circuit according to claim 11, wherein said phase detecting means is arranged to provide said oscillator with control signals of first, second and third levels which respectively correspond to said first, second and center frequencies.

* * * * *